United States Patent [19]

Deacon et al.

[11] 4,030,050

[45] June 14, 1977

[54] ACOUSTIC SURFACE WAVE FILTERS

[75] Inventors: John Maxwell Deacon, Towcester; James Heighway, Silverstone, both of England

[73] Assignee: Plessey Handel und Investments A.G., Zug, Switzerland

[22] Filed: Sept. 25, 1975

[21] Appl. No.: 616,689

[30] Foreign Application Priority Data

Sept. 26, 1974 United Kingdom ............ 41876/74

[52] U.S. Cl. .................................. 333/72; 310/8.2; 310/9.8; 333/30 R

[51] Int. Cl.$^2$ ..................... H03H 9/04; H03H 9/06; H03H 9/26; H03H 9/32

[58] Field of Search ............... 333/72, 30 R; 310/8, 310/8.1, 8.2, 9.8

[56] References Cited

UNITED STATES PATENTS

| | | | |
|---|---|---|---|
| 3,376,572 | 4/1968 | Mayo | 333/72 X |
| 3,633,132 | 1/1972 | Hartemann | 333/30 R |
| 3,663,899 | 5/1972 | Dieulesaint et al. | 333/70 T |
| 3,699,364 | 10/1972 | Gerard | 333/72 X |
| 3,753,166 | 8/1973 | Worley et al. | 333/72 |
| 3,792,381 | 2/1974 | Bristol | 333/72 |
| 3,803,520 | 4/1974 | Bristol et al. | 333/30 R |
| 3,836,876 | 9/1974 | Marshall et al. | 333/72 X |
| 3,870,975 | 3/1975 | Vasile | 333/30 R |

OTHER PUBLICATIONS

Marshall et al., "Surface Acoustic Multistrip Components and Their Applications", in IEEE Trans. on Microwave Theory an Techniques, vol. MTT21, No. 4, Apr. 1973, pp. 216–225.

*Primary Examiner*—Alfred E. Smith
*Assistant Examiner*—Marvin Nussbaum
*Attorney, Agent, or Firm*—Fleit & Jacobson

[57] ABSTRACT

An acoustic surface wave filter for use as an intermediate frequency filter in a P.A.L. color television receiver comprising input and output transducers each having fingers of conductive material supported on a piezoelectric substrate the fingers of each transducer being electrically connected to a pair of terminal pads so that the fingers connected to one pad interleave with the fingers connected to the other pad, the transducers being mutually offset in a direction orthogonal to the direction of acoustic surface wave propagation and coupled by means of a multistrip coupler.

5 Claims, 4 Drawing Figures

ACOUSTIC SURFACE WAVE FILTERS

This invention relates to acoustic surface wave filters.

An acoustic surface wave filter is well known and comprises a substrate of lithium niobate or other piezoelectric material supporting mutually acoustically coupled input and output transducers each of which comprises interleaved fingers of conductive material the spacing between the fingers largely determining the frequency of the filter and the number of fingers largely determining the bandwidth of the filter.

The invention is particularly concerned with the provision of a filter suitable for use as an intermediate frequency filter in a colour television receiver and more particularly it seeks to provide an intermediate frequency filter suitable for use in a colour television receiver designed for operation in accordance with the British P.A.L. system.

According to the present invention an acoustic surface wave filter comprises, input and output transducers each having fingers of conductive material supported on a piezoelectric substrate, the fingers of each transducer being electrically connected to a pair of terminal pads so that the fingers connected to one pad interleave with the fingers connected to the other pad, the transducers being mutually positionally offset in a direction orthogonal to the direction of acoustic surface wave propagation and coupled by means of a multistrip coupler, the spacing between adjacent fingers of at least one transducer being non-uniform, the overlap between adjacent fingers of at least one transducer being non-uniform, at least some of the fingers of at least one transducer being bifurcated, and at least some electrically interconnected fingers of at least one transducer being arranged to sandwich therebetween a dummy finger. The substrate adjacent the outside faces of the transducers remote from the multistrip coupler may have applied thereto material suitable for absorbing acoustic surface waves.

The interleaved fingers of one transducer may be uniformly spaced and overlap uniformly.

The two parts of each bifurcated finger may be electrically interconnected.

The interconnections between the parts of each bifurcated finger may be at the end of the fingers remote from the terminal pad to which they are connected.

At least some fingers in addition to the first and last fingers of each transducer may be arranged on at least one transducer to overlap on one side only with an adjacent finger electrically connected to the other terminal pad.

Some exemplary embodiments of the invention will now be described with reference to the accompanying drawings in which.

Figure 1:
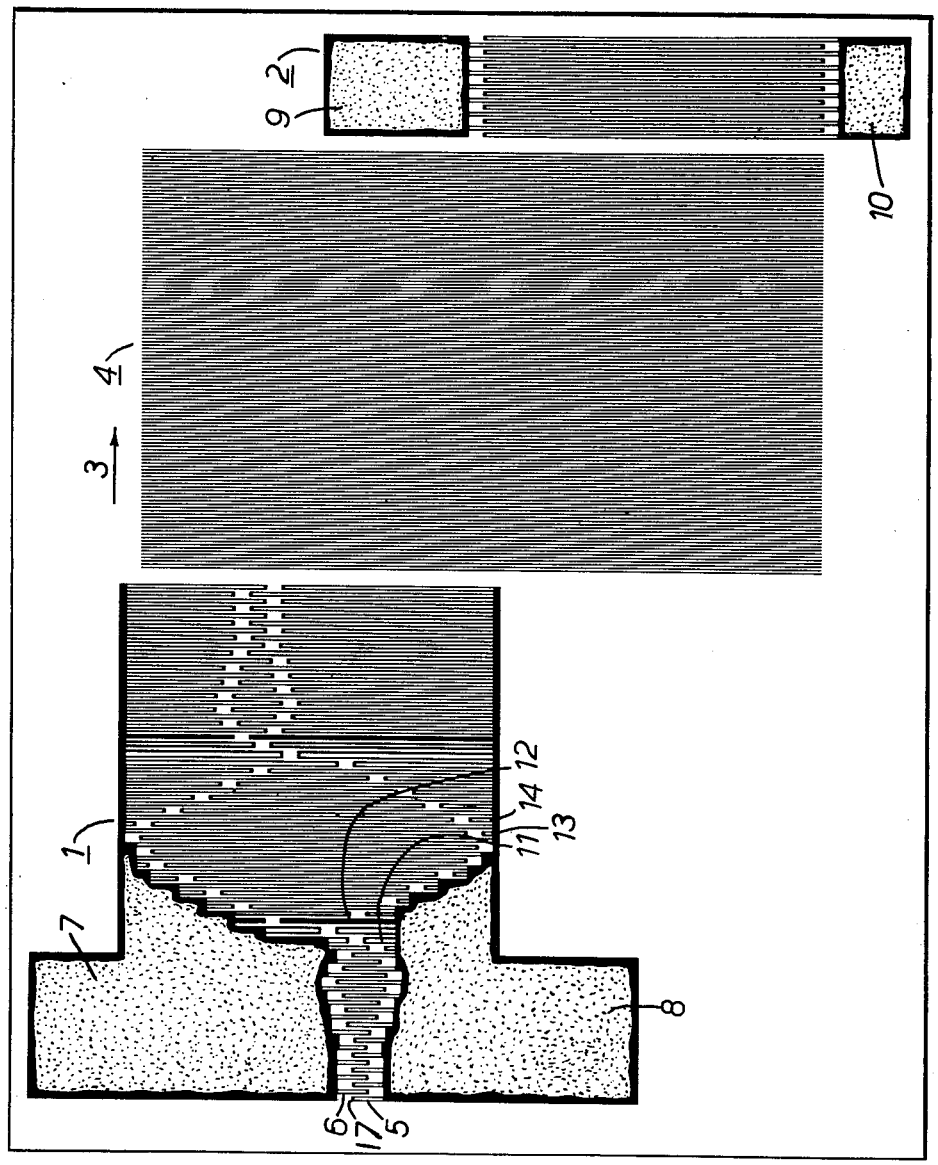
FIG. 1 is a plan view of an acoustic surface wave filter.

Referring now to the drawings, an acoustic surface wave filter comprises an input transducer 1 and an output transducer 2 mutually offset in a direction orthogonal to the direction of surface wave propagation indicated by the arrow 3 and coupled by means of a multistrip coupler 4. It will be appreciated that the input and output transducers 1 and 2 and the multistrip coupler 4 are formed by a conventional thin film or photo lithographic technique and comprise regions of gold or other conductive material laid down on a substrate fabricated from a piezoelectric material such as lithium niobate. Although in the present example the transducer 1 has been referred to as the input transducer and transducer 2 has been referred to as output transducer the device is reversible.

It can be seen that the fingers such as fingers 5 and 6 of transducers 1 are all bifurcated and electrically interconnected across their ends by means of bridges such as the bridge 17. The transducer 1 has a pair of terminal pads 7 and 8 and the transducer 2 has a pair of terminal pads 9 and 10. It can be seen that the fingers electrically connected to the terminal pad 7 are interleaved with the fingers connected to the terminal pad 8 and similarly on the transducer 2 the fingers connected to the terminal pad 9 are interleaved with the fingers connected to the terminal pad 10. The resonant frequency of the filter is in general determined by the spacing between the fingers which is uniform in the case of the transducer 2 and which is non-uniform in the case of the transducer 1. The bandwidth of the filter is largely determined by the number of fingers provided and by the shape and configuration of the overlap which is non-uniform in the transducer 1 and uniform in the transducer 2. By arranging that the overlap conforms to the pattern shown, a predetermined filter characteristic is tailored and in the present case the overlap is chosen to provide a characteristic which is suitable for an intermediate frequency filter for use in a television receiver designed for operation in accordance with the British P.A.L. system. By using the multistrip coupler 4 to couple the transducers 1 and 2 bulk waves, which travel from the input transducer in a generally straight line in the direction of propagation of the acoustic surface waves, are not received by the output transducer 2 which is positionally offset therefrom. Acoustic surface waves on the other hand are received by the output transducer 2 since the multistrip coupler 4 serves to transfer the energy in the acoustic surface waves from the input transducer 1 to the output transducer 2. Thus distortion of the filter characteristic which can be introduced by the effect of the bulk waves is obviated or at least significantly reduced.

By providing bifurcated fingers additional surfaces are positioned in the path of wave fronts in predetermined positions propagated and this can be shown to have the effect of cancelling certain undesirable reflections.

Since the fingers are dimensionally reduced by bifurcation the ends are bridged by means of the bridge 17 which has little or no effect on the operation of the filter but which serves to increase the yield in production. This is because a break in one part of a finger has no detrimental effect since electrical connection with its associated pad is made via the bridge.

Although the bridges in this example are shown at the ends of the bifurcated fingers they may alternatively be positioned in other places therealong.

Although in general, with the exception of the first and last fingers of each transducer, each finger lies sandwiched between two fingers connected to the other terminal pad. In the case of the finger 11 for example and the finger 12 they are adjacent to a finger connected to the other terminal pad on only one side thereof. It has been found that by introducing this particular feature, the characteristics of the filter can be adjusted in a manner which is desirable when fabricating an I.F. filter suitable for a colour television receiver. The first few fingers of the transducer 1 are interleaved in a conventional way corresponding with the fingers of the transducer 2 but in order to provide uniform wave fronts which depend upon the wave front passing through the same numbers of fingers over the whole width of the front, dummy fingers such as fingers 13 and 14 are provided which are sandwiched between fingers connected to the same terminal pad and which are provided to produce wave fronts which are uniform.

Figure 2:
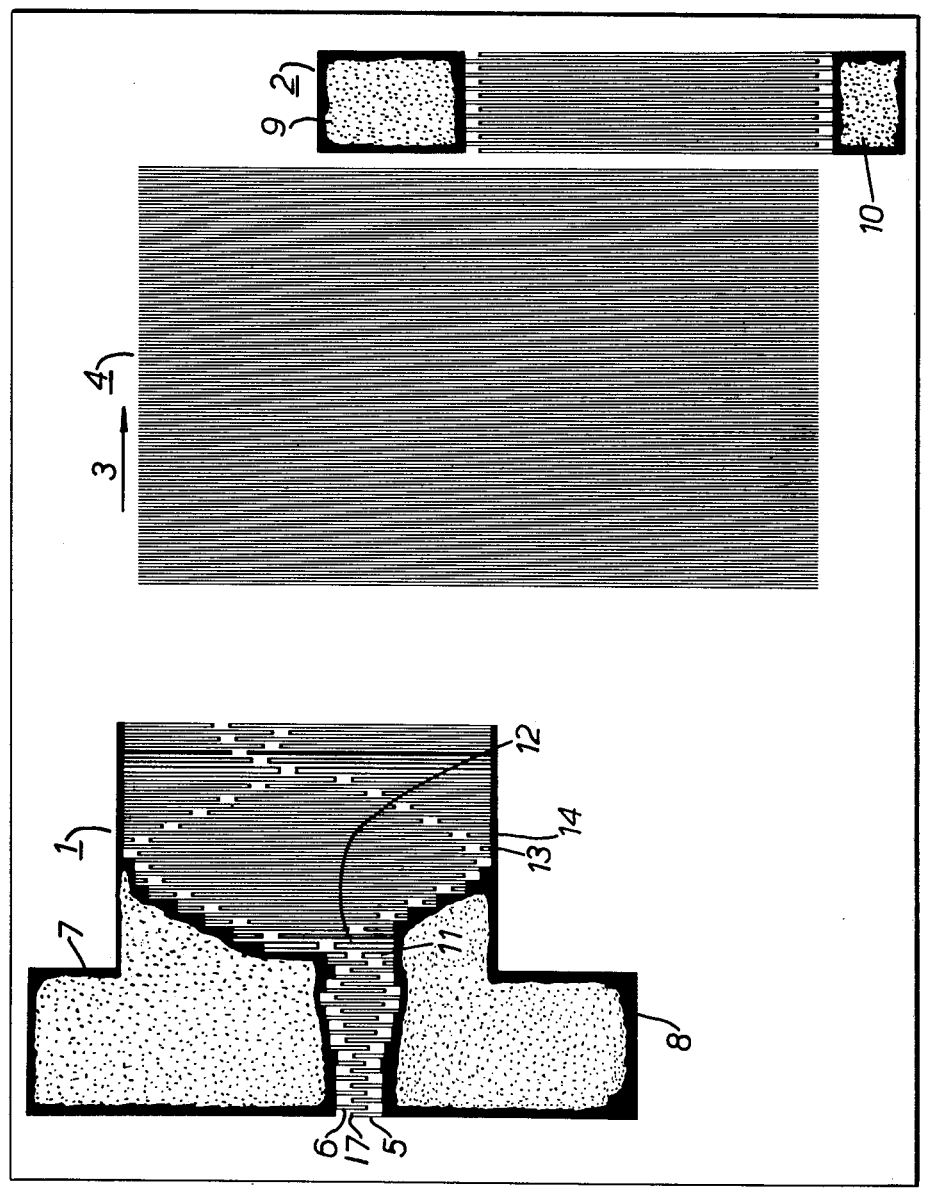
FIG. 2 is a plan view of an alternative surface wave filter.

Referring now to FIG. 2 a filter is provided which is generally similar to the filter shown in FIG. 1 but in which a number of elements of the transducer 1 have been omitted to provide a modified filter characteristic.

Figure 3:
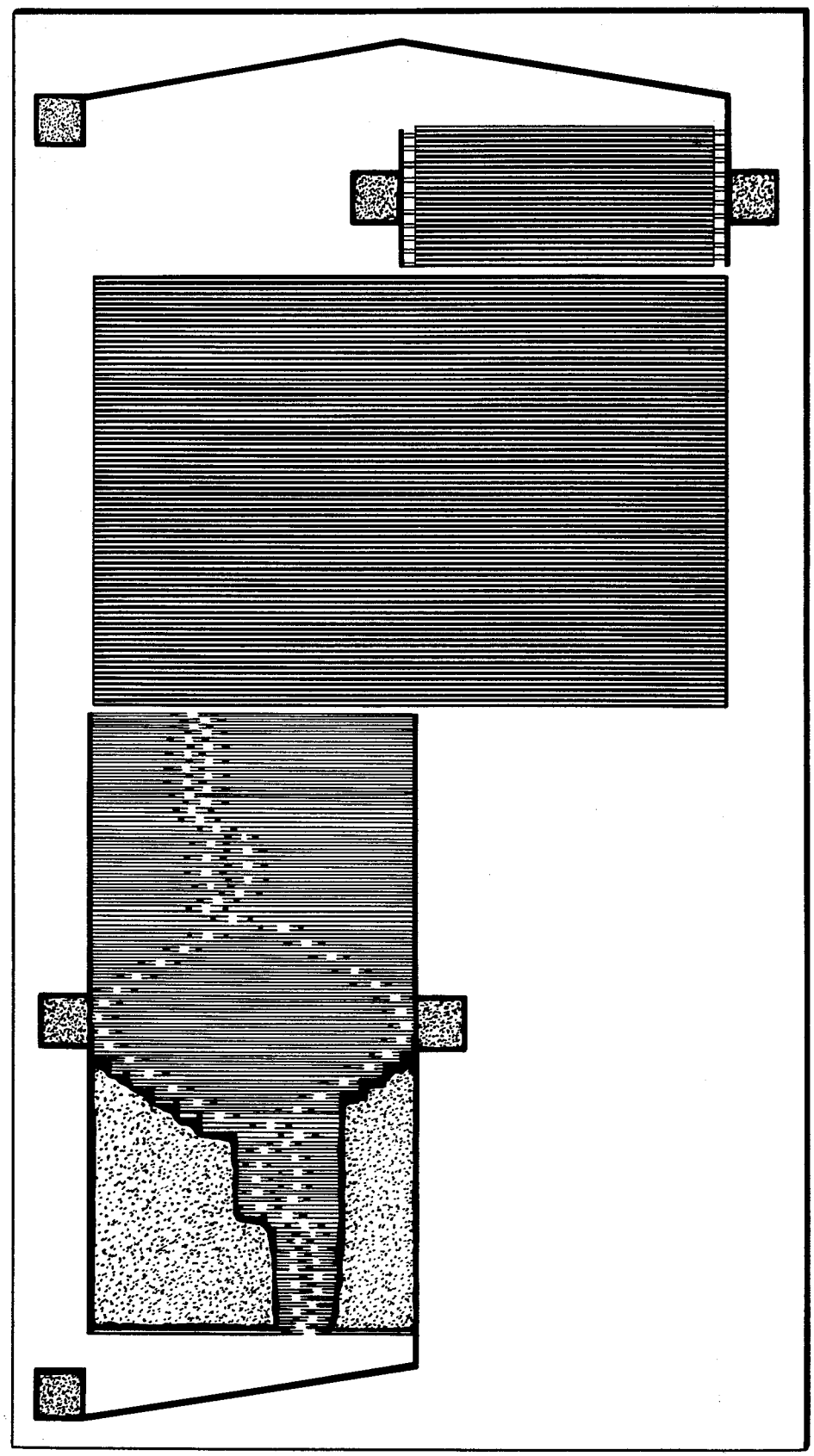
FIG. 3 is a plan view of another alternative surface wave filter.
Figure 4:
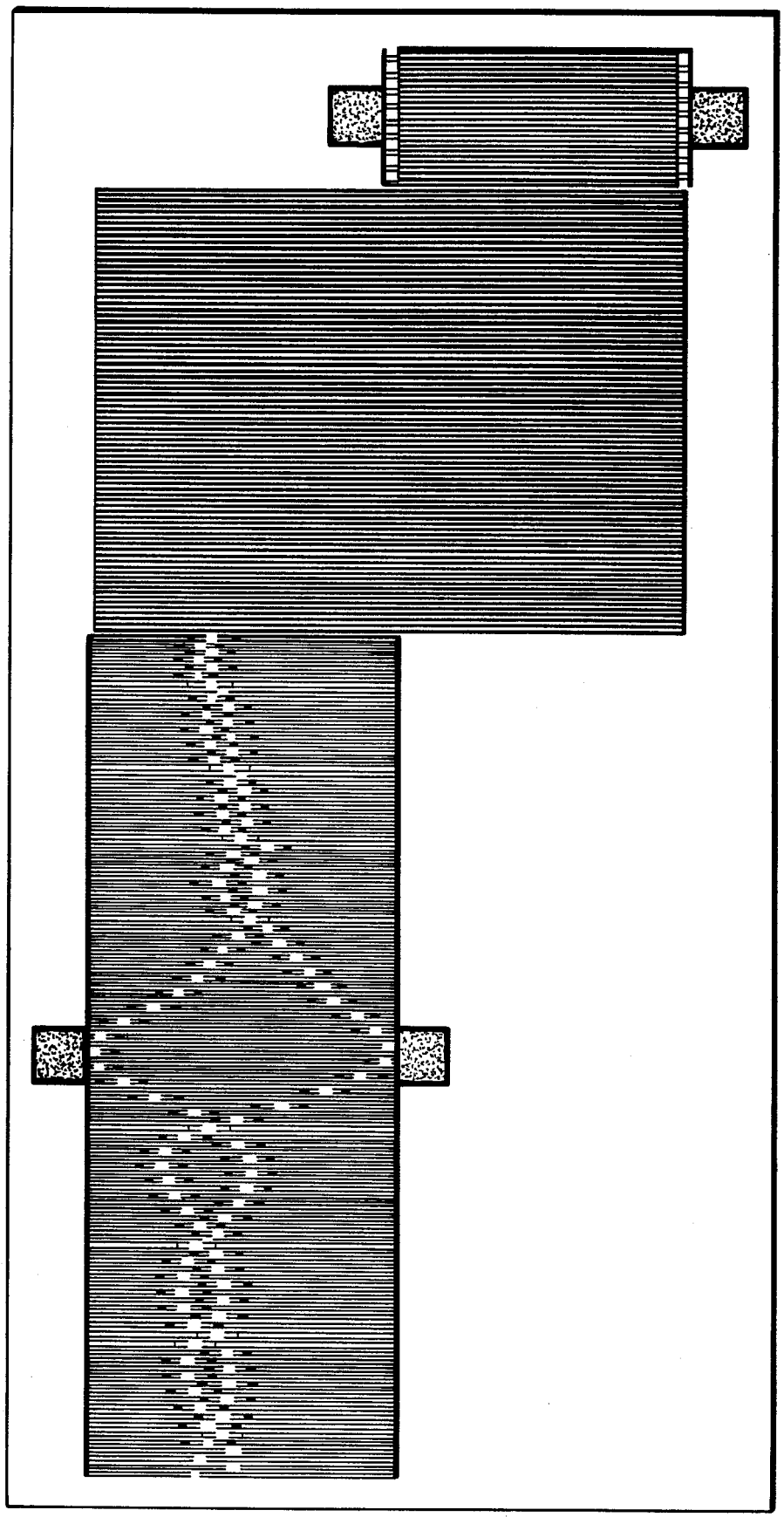
FIG. 4 is a plan view of yet another alternative surface wave filter.

FIGS. 3 and 4 show different configurations which are suitable also for use as intermediate frequency filters in colour T.V. receivers but which have been fabricated to afford alternative bandwidths and centre frequencies. Whereas the filter shown in FIG. 1 and FIG. 2 are suitable for use in a T.V. reciever operating in accordance with the British P.A.L. system the filter as shown in FIG. 3 is suitable for use in a colour set which satisfies U.S.A. requirement and the filter shown in FIG. 4 is suitable for European requirements.

In the filters of FIG. 1 and FIG. 2, FIGS. 3 and FIG. 4, regions of absorbent material (not shown) are provided adjacent the input and output transducers on the sides thereof remote from the multistrip coupler to absorb acoustic surface wave reflections. The absorbent material used may be a plastics material such as epoxy resin or a paint or rubberised adhesive type material.

What we claim is:

1. An acoustic surface wave filter comprising input and output transducers each having fingers of conductive material supported on a piezoelectric substrate, a pair of terminal pads to which the fingers of each transducer are electrically connected so that the fingers connected to one pad interleave with the fingers of the other pad, the transducers being mutually positionally offset in a direction orthogonal to the direction of acoustic surface wave propagation, a multistrip coupler by means of which the transducers are acoustically coupled, the spacing between adjacent fingers of at least one transducer being non-uniform, the overlap between adjacent fingers of at least one transducer being non-uniform, at least some of the fingers of at least one transducer being bifurcated so as to comprise two parts which are bridged so as to be electrically interconnected and at least some electrically connected fingers of at least one transducer being arranged to sandwich therebetween a dummy finger.

2. An acoustic surface wave filter as claimed in claim 1, wherein the substrate adjacent the outside faces of the transducers remote from the multistrip coupler has applied thereto materials suitable for absorbing acoustic surface waves.

3. An acoustic surface wave filter as claimed in claim 2, wherein the interleaved fingers of one transducer are uniformly spaced and overlap uniformly.

4. An acoustic surface wave filter as claimed in claim 1 wherein the interconnections between the parts of each bifurcated finger are at the end of the fingers remote from the terminal pad to which they are connected.

5. An acoustic surface wave filter as claimed in claim 1, wherein at least some fingers in addition to the first and last fingers of each transducer are arranged on at least one transducer to overlap on one side only with an adjacent finger electrically connected to the other terminal pad.

* * * * *